United States Patent [19]
Kasai

[11] Patent Number: 5,973,371
[45] Date of Patent: Oct. 26, 1999

[54] SEMICONDUCTOR DEVICE WITH MARGINLESS CONTACT HOLE

[75] Inventor: Naoki Kasai, Tokyo, Japan

[73] Assignee: NEC Corporation, Tokyo, Japan

[21] Appl. No.: 08/902,109

[22] Filed: Jul. 29, 1997

[30] Foreign Application Priority Data

Jul. 30, 1996 [JP] Japan ................................ 8-200712

[51] Int. Cl.[6] ................................................ H01L 29/76
[52] U.S. Cl. .......................... 257/382; 257/296; 257/369; 257/381
[58] Field of Search .................... 257/296, 369, 257/381, 382

[56] References Cited

U.S. PATENT DOCUMENTS

| | | | |
|---|---|---|---|
| 5,684,313 | 11/1997 | Kenney | 257/296 |
| 5,705,838 | 1/1998 | Jost et al. | 257/296 |
| 5,706,164 | 1/1998 | Jeng | 361/321.4 |

OTHER PUBLICATIONS

Yamada, et al., "Spread Source/Drain (SSD) MOSFET Using Selective Silicon Growth for 64Mbit DRAMs", IEDM Technical Digest, 1989, pp. 35–38.

Mizuno, et al. "$Si_3N_4/SiO_2$ Spacer Induced High Reliability in LDDMOSFET and Its Simple Degradation Model", IEDM Technical Digest, 1988, pp.234–237.

Primary Examiner—Valencia Martin-Wallace
Attorney, Agent, or Firm—Whitham, Curtis & Whitham

[57] ABSTRACT

A semiconductor device is provided, which is capable of miniaturization to a level corresponding to 1-Gb DRAMs. A first interlayer insulating layer is formed on or over a semiconductor substrate to cover a first-level conductive layer. First and second conductive sublayers of a second-level conductive layer are formed on the first interlayer insulating layer. First and second insulating caps are formed on the first and second sublayers, respectively. A lower contact hole penetrating the first insulating layer is formed to be self-aligned with the first and second sublayers. A conductive pad is formed on the first-level conductive layer in the lower contact hole to be electrically insulated from the first and second sublayers by an insulating spacer. A second interlayer insulating layer with an upper contact hole communicating with the lower contact hole is formed on the first interlayer insulating layer. A third-level conductive layer is formed on the second interlayer insulating layer to be contacted with the conductive pad through the upper contact hole.

8 Claims, 5 Drawing Sheets

SEMICONDUCTOR DEVICE WITH MARGINLESS CONTACT HOLE

BACKGROUND OF THE INVENTION

1. Field of the Invention

The present invention relates to a semiconductor device and more particularly, to a semiconductor device in which upper and lower wiring layers are electrically connected to each other through a contact hole formed by a marginless formation technique.

2. Description of the Prior Art

In recent years, the integration scale of integrated circuits (ICs) has been becoming larger and larger through miniaturization of semiconductor device Now, semiconductor devices with an ultra-large integration scale such as 1-Gigabit (Gb) Dynamic Random-Access Memories (DRAMs) have developed and experimentally fabricated according to the 0.15-$\mu$m-order design rule. To cope with such the ultra-large-scale integration of devices, it has been strongly required to eliminate the mask-alignment margin for lithography processes in the fabrication process sequence.

However, the mask-alignment margin has been provided for preventing any problems occurring due to the possible mask-alignment error (i.e., misalignment) during the lithography processes. Therefore, this margin is very difficult to be completely eliminated.

Specifically, in the typical semiconductor device fabrication sequence, a lot of patterned layers, which are usually made of various materials such as metal, semiconductor, dielectric, and so on, are successively formed to be stacked on or over a semiconductor substrate. After a lower patterned layer is formed on or over the substrate, a next, upper layer is formed on the lower patterned layer thus formed. Subsequently, a patterned mask for this upper layer is formed on the upper layer. Then, using this patterned mask, the upper layer is patterned to be aligned with the lower patterned layer by a popular lithography technique.

In this case, it is usually that some placement or overlay error occurs between the upper and lower patterned layers and as a result, a mask-alignment margin is essential for the conventional semiconductor devices. However, this margin will be a cause inhibiting larger-scale integration of devices.

To realize the elimination of the mask-alignment margin, various techniques have been studied and developed, which are termed the "marginless formation techniques".

An important one of the known marginless formation techniques is to eliminate margins for contact holes which are typically formed in an interlayer insulating layer. This marginless formation technique for contact-holes is one of the key measures in view of enhancement of the integration scale and packing density of semiconductor devices, because the contact hole is used for electrically interconnecting a wiring layer with a semiconductor substrate or another wiring layer through an intervening insulating layer.

An important or prevalent one of the known marginless formation techniques for contact holes is termed the "self-aligned contact hole" technique. To realize this technique, concrete structures and/or formation methods have been examined in various ways.

The Japanese Non-Examined Patent Publication No. 4-159725, which was published in June, 1992, discloses a fabrication method of a semiconductor device that realizes the "self-aligned contact hole" technique.

In this conventional method, a pair of insulating sidewall spacers are formed at each side of a gate electrode of a Metal-Oxide-Semiconductor Field-Effect Transistor (MOSFET). A contact hole is formed in an interlayer insulating layer covering the MOSFET to reach one of a pair of underlying source/drain regions formed in a semiconductor substrate. The contact hole is self-aligned with the gate electrode.

FIGS. 1A to 1F show the conventional method disclosed in the Japanese Non-Examined Patent Publication No. 4-159725.

First, as shown in FIG. 1A, a patterned field oxide layer 102 is formed on a main surface of a p-type silicon substrate 101 to selectively expose the main surface. A gate oxide layer 103 is formed on the exposed main surface of the substrate 101.

Next, a polycrystalline silicon layer 110 is formed on the field oxide layer 102 and the gate oxide layer 103 over the whole substrate 101 by a Chemical Vapor Deposition (CVD) process. A silicon nitride ($SiN_x$) layer 105 is formed on the polycrystalline silicon layer 110 over the whole substrate 101 by a CVD process. The state at this stage is shown in FIG. 1A.

Then, the silicon nitride layer 105 and the polycrystalline silicon layer 110 are successively patterned by popular photolithography and Reactive-Ion Etching (RIE) processes. Thus, a gate electrode 104 is formed on the gate oxide layer 103 by the remaining polycrystalline silicon layer 110, and a cap 105a is formed by the remaining silicon nitride layer 105, as shown in FIG. 1B.

Using the gate electrode 104, the cap 105a, and the field oxide layer 102 as a mask, an n-type dopant such as arsenic (As) is selectively ion-implanted into the substrate 101, forming a pair of n-type source/drain regions 106 at each side of the gate electrode 104 in the surface region of the substrate 101. The state at this stage is shown in FIG. 1B.

Then, the uncovered gate oxide layer 103 is removed by using the cap 105a and the gate electrode 104 as a mask. However, this process is not always necessary. In other words, the gate oxide layer 103 may be left in the state shown in FIG. 1B.

Subsequently, a silicon nitride layer 107 is deposited over the whole substrate 101 by a CVD process to cover the MOSFET. The layer 107 is formed on the field oxide layer 102, the exposed substrate 101, the gate electrode 104, and the cap 105a, as shown in FIG. 1C.

The silicon nitride layer 107 is then etched back selectively, thereby forming a pair of sidewall spacers 107a at each side of the gate electrode 104, as shown in FIG. 1D. The bottoms of the sidewall spacers 107a are directly contacted with the substrate 101, i.e., the source/drain regions 106, because the gate oxide layer 103 has been removed.

Following this, a silicon dioxide ($SiO_2$) layer 10B serving as an interlayer insulating layer is deposited by a CVD process over the whole substrate 101, covering the MOSFET, as shown in FIG. 1E.

A photoresist film 111 with a window 112 is formed on the interlayer insulating layer 108 thus deposited. As shown in FIG. 1E, an end of the window 112 is overlapped with a corresponding one of the pair of sidewall spacers 107a.

Using the photoresist film 111 as a mask, the interlayer insulating layer 108 is selectively etched by a wet etching process using buffered hydrogen fluoride (HF) Thus, a contact hole 108a is formed in the interlayer insulating layer 108 at a corresponding position to the window 112. The contact hole 108a uncovers a corresponding one of the pair of source/drain regions 106.

If the gate oxide layer 103 is not removed in the step in FIG. 1C, the gate oxide layer 103 is selectively etched during the etching process for the interlayer insulating layer 108.

After removing the photoresist film 111, a patterned wiring layer 109 is formed on the interlayer insulating layer 108 by popular processes. The wiring layer 109 is contacted with and electrically connected to the corresponding one of the source/drain regions 106 through the contact hole 108a of the interlayer insulating layer 108. The state at this stage is shown in FIG. 1F.

Another structure realizing the "self-aligned contact hole" technique was disclosed by T. Yamada et al. in the technical digest, pp. 35–38, 1989 International Electron Devices Meeting (IEDM), published in 1989.

In this conventional structure, a conductive layer is selectively grown on a source/drain region in self-alignment with a gate electrode using insulating sidewall spacers and a field oxide layer. An interlayer insulating layer formed to cover the selectively-grown conductive layer. A contact hole is formed in the interlayer insulating layer to extend the underlying conductive layer.

FIG. 2 shows the conventional semiconductor device disclosed in the 1989 IEDM technical digest.

A field oxide layer 122 is selectively formed on a main surface of a p-type silicon substrate 121. Gate electrodes 124 for MOSFETs are formed on the uncovered main surface of the substrate 121 through gate oxide layers 123, respectively. Silicon dioxide caps 125 are formed on the top faces of the gate electrodes 124, respectively. Pairs of insulating sidewall spacers 126 are formed at each side of the gate electrodes 124, respectively. Pairs of n-type source/drain regions 127 for the MOSFETs are formed in the surface region of the substrate 121 in self-alignment with the gate electrodes 124 and the sidewall spacers 126, respectively.

Silicon layers 128 are selectively grown on the exposed main surface of the substrate 121 between the sidewall spacers 126 and the opposing field oxide layer 122, respectively. The silicon layers 128 are doped with a dopant by ion-implantation to decrease their electric resistance. The tops of the silicon layers 128 are higher than the tops of the caps 125. One ends of the silicon layers 128 are located on the field oxide layer 122 to be overlapped therewith. The other ends of the silicon layers 128 are located on the corresponding silicon dioxide caps 125 to be overlapped therewith.

An interlayer insulating layer 129 is formed to cover the MOSFETs, the silicon layers 128, and the exposed filed oxide layer 122. Contact holes 129a are formed in the layer 129 to extend the corresponding silicon layers 128.

Wiring layers 130 are formed on the interlayer insulating layer 129 to be contacted with the silicon layers 128 through the corresponding contact holes 129a, respectively.

With the conventional method disclosed in the Japanese Non-Examined Patent Publication No. 4-159725, as shown in FIGS. 1A to 1F, the top and side faces of the gate electrode 104 are covered with silicon nitride cap 105a and the silicon nitride spacers 107a, respectively. Therefore, the contact hole 108a of the interlayer insulating layer 108 is formed in self-alignment with the gate electrode 104 without any margin. However, this method has the following two problems.

A first problem is that a large parasitic capacitance tends to occur in the vicinity of the contact hole 108a. This is because the gate electrode 104 and the wiring layer 109 are separated or electrically insulated by the silicon nitride spacer 107a with a relatively large dielectric constant in the vicinity of the contact hole 108a. This large parasitic capacitance will give a bad effect to high speed operation of the semiconductor device.

A second problem is that the hot-carrier resistance tends to degrade, resulting in deterioration in long-term reliability of the MOSFET. This problem is caused by the following reason.

As seen from FIG. 1F, the bottoms of the silicon nitride spacers 107a are directly contacted with the n-type source/drain regions 106, respectively. Therefore, hot carriers generated in one of the source/drain regions 106 that serves as a drain region tend to be trapped by a corresponding one of the spacers 107a. As a result, the electrical characteristics of the MOSFET such as the threshold voltage tend to fluctuate or deviate with time. This means that the hot-carrier resistance tends to degrade.

This phenomenon was reported by T. Mizuno et al. in the 1988 IEDM technical digest, pp. 234–237, published in 1988.

With the conventional structure disclosed in the 1989 IEDM technical digest, as seen from FIG. 2, the top and side faces of the gate electrode 124 are covered with the silicon dioxide cap layer 125 and the silicon dioxide spacers 126, respectively. Silicon dioxide has a smaller dielectric constant than that of silicon nitride. Therefore, the above first problem about the parasitic capacitance in the conventional method disclosed in the Japanese Non-Examined Patent Publication No. 4-159725 is solved.

Moreover, the sidewall spacers 126 are located on the corresponding gate oxide layer 123 and as a result, the above second problem about the long-term reliability in the conventional method disclosed in the Japanese Non-Examined Patent Publication No. 4-159725 is solved.

However, the structure in FIG. 2 has another problem relating to electrical insulation between the cap layer 125 and the selectively-grown silicon layer 128.

Specifically, when the contact holes 129a are formed in the interlayer insulating layer 129 by an etching process, the contact holes 129a may be located with some lateral shift with respect to the silicon layers 128 and as a result, they may be close to or contacted with the corresponding silicon-dioxide caps 125 due to mask-alignment error. If the contact holes 129a are close to the corresponding silicon-dioxide cap layers 125, leakage-current increase or short-circuit tends to occur between the wiring layers 130 and the corresponding gate electrodes 124. If the contact holes 129a are contacted with the corresponding silicon-dioxide caps 125, short-circuit will occur between the wiring layers 130 and the corresponding gate electrodes 124.

To prevent these disadvantages, it is necessary for the contact holes 129a not to be contacted or overlapped with the corresponding caps 125. In other words, the overlapped length 131 of each selectively-grown silicon layer 128 with the corresponding cap 125 needs to be longer than the alignment margin 133 of the corresponding silicon layer 128.

However, if the overlapped length 131 of the selectively-grown silicon layer 128 is designed to be longer than the alignment margin 133, the gap or space 132 between the opposing ends of the adjoining two silicon layers 128 becomes narrow. This leads to leakage current increase or short-circuit between these two layers 128 or the adjoining two wiring layers 130.

Thus, the electrical insulation between the wiring layers 130 and the corresponding gate electrodes 124 is a trade-off for the electrical insulation between the adjoining silicon layers 128 or the wiring layers 130. This means that it is difficult for the conventional structure disclosed in FIG. 2 to miniaturize the semiconductor device to thereby increase its packing density.

For example, for 1-Gb DRAMS designed with the 0.15-μm rule, it is typical that the width of gate electrode 124 (i.e., the gate length) is set as approximately 0.15 μm (150 nm), and that the alignment margin 133 for the contact holes 129a is set as approximately 0.05 μm (50 nm). As a result, if priority is given to the electrical insulation between the wiring layers 130 and the corresponding gate electrodes 124, the space 132 of the selective-grown silicon layers 128 will be designed as a value less than 0.05 μm (50 nm).

SUMMARY OF THE INVENTION

Accordingly, an object of the present invention is to provide a semiconductor device capable of further miniaturization to a level corresponding to 1-Gb DRAMs.

Another object of the present invention is to provide a semiconductor device that is readily miniaturized without occurring the above-identified problems relating to the parasitic capacitance and the electrical insulation.

Still another object of the present invention is to provide a semiconductor device that prevents the long-term reliability from degrading with time.

The above objects together with others not specifically mentioned will become clear to those skilled in the art from the following description.

A semiconductor device according to a first aspect of the present invention is comprised of a first-level conductive layer formed in, on, or over a semiconductor substrate.

A first interlayer insulating layer is formed on or over the substrate to cover the first-level conductive layer. The first interlayer insulating layer has a first contact hole extending to the first-level conductive layer.

A second-level conductive layer is formed on the first interlayer insulating layer. The second-level conductive layer has first and second conductive sublayers separated from each other by a gap.

First and second insulating caps are formed on the first and second conductive sublayers of the second-level conductive layer, respectively. The first and second insulating caps are separated from each other by a gap. The first and second insulating caps cover the whole top faces of the first and second conductive sublayers, respectively. The gap of the first and second insulating caps and the gap of the first and second conductive sublayers communicate with the first contact hole of the first insulating layer. The lower contact hole is self-aligned with at least one of the first and second conductive sublayers.

An insulating spacer is formed in the lower contact hole to cover inner side faces of the first and second conductive sublayers of the second-level conductive layer. The insulating spacer is made of a material having a lower dielectric constant than silicon nitride.

A conductive pad is formed in the lower contact hole to be contacted with and electrically connected to the first-level conductive layer. The top of the conductive pad is overlapped with the first and second insulating caps. The conductive pad is electrically insulated from the first and second conductive sublayers of the second-level conductive layer by the insulating spacer.

A second interlayer insulating layer is formed on the first interlayer insulating layer to cover the second-level conductive layer, the first and second insulating caps, and the conductive pad. The second interlayer insulating layer has a second contact hole extending to the conductive pad. The second contact hole communicates with the lower contact hole of the first interlayer insulating layer through the gap of the first and second insulating caps and the gap of the first and second conductive sublayers.

Each of the first and second insulating caps is made of an etching resistant material against an etching action applied during a process of forming the second window in the second interlayer insulating layer.

A third-level conductive layer is formed on the second interlayer insulating layer to be contacted with and electrically connected to the conductive pad through the second contact hole.

Thus, the third-level conductive layer is electrically connected to the first-level conductive layer through the conductive pad while the third-level conductive layer is electrically insulated from the second-level conductive layer.

With the semiconductor device according to the first aspect of the present invention, the lower contact hole is formed in the first interlayer insulating layer to be self-aligned with at least one of the first and second conductive sublayers of the second-level conductive layer. Therefore, no margin is required for the formation of the lower contact hole.

On the other hand, if the position of the second contact hole of the second interlayer insulating layer is deviated from its designed position with respect to the lower contact hole or the conductive pad, one of the first and second insulating caps may be exposed from the second interlayer insulating layer.

However, each of the first and second insulating caps is made of an etching resistant material against an etching action applied during a process of forming the second window in the second interlayer insulating layer. Therefore, the exposed one of the first and second insulating caps is scarcely etched during the process. This means that electrical insulation between the third-level conductive layer and the second-level conductive layer is ensured.

Further, because of the high etching resistance of the first and second insulating caps, the conductive pad may be laid out apart from another adjacent conductive pad at a sufficiently long distance. This means that electrical insulation between the adjoining two conductive pads is ensured.

Moreover, since the insulating spacer is made of a material having a lower dielectric constant than silicon nitride, the parasitic capacitance is decreased compared with the previously-described conventional structure in FIG. 2.

As a result, the semiconductor device according to the first aspect of the present invention can be readily miniaturized without the above problems relating to the parasitic capacitance and the electrical insulation.

In the semiconductor device according to the first aspect, preferably, each of the first and second insulating caps is made of silicon nitride ($SiN_x$), silicon oxynitride ($SiON_x$), or alumina ($Al_2O_3$). This is because these materials have good etching resistance against an etching action for $SiO_2$ and good insulating characteristics.

It is preferred that the insulating spacer is made of silicon oxide ($SiO_x$), fluorine-containing silicon oxide (SiOF), Phosphor-Silicate Glass (PSG), or Boron-doped PSG (BPSG). The reason is that these materials have lower dielectric constants than silicon nitride and good insulating characteristics.

It is preferred that the conductive pad is made of silicon (Si) or tungsten (W), because these two materials are readily grown selectively on the first-level conductive layer.

A semiconductor device according to a second aspect of the present invention is comprised of a semiconductor substrate of a first conductivity type. A gate insulating layer is formed on the substrate. A gate electrode is formed on the gate insulating layer.

An insulating cap is formed on the gate electrode. The insulating cap covers the whole top face of the gate electrode.

First and second insulating sidewall spacers are formed on the gate insulating layer at each side of the gate electrode. The first sidewall spacer covers side faces of the gate electrode and the cap at one side of the gate electrode. The second sidewall spacer covers side faces of the gate electrode and the cap at the other side of the gate electrode.

First and second source/drain regions of a second conductivity type are formed in the substrate at each side of the gate electrode. The first and second source/drain regions are self-aligned with the gate electrode.

First and second windows are formed in the gate insulating layer to uncover the first and second source/drain regions, respectively. The first and second windows are self-aligned with the first and second insulating sidewall spacers, respectively.

First and second conductive pads are formed to be contacted with and electrically connected to the first and second source/drain regions through the first and second windows, respectively. The tops of the first and second conductive pads are higher than the top of the insulating cap. The tops of the first and second conductive pads are overlapped with the insulating cap.

An interlayer insulating layer is formed on or over the substrate to cover the first and second conductive pads, the first and second insulating sidewall spacers, and the insulating cap. The interlayer insulating layer has first and second contact holes extending to the first and second conductive pads, respectively.

A conductive wiring layer is formed on the interlayer insulating layer to be contacted with and electrically connected to the first and second conductive pads through the first and second contact holes of the interlayer insulating layer, respectively.

With the semiconductor device according to the second aspect of the present invention, the first and second windows are formed in the gate insulating layer to be self-aligned with the first and second insulating sidewall spacers, respectively. Therefore, no margin is required for the formation of the first and second windows.

On the other hand, if the positions of the first and second contact holes of the interlayer insulating layer are deviated from their designed positions with respect to the first and second conductive pads, the insulating cap may be partially exposed from the interlayer insulating layer.

However, the insulating cap is made of an etching resistant material against the etching action applied during a process of forming the first and second contact holes in the interlayer insulating layer. Therefore, the exposed area of the insulating cap is scarcely etched during the process. This means that electrical insulation between the gate electrode and the wiring layer is ensured.

Further, because of the high etching resistance of the insulating cap, the first and second conductive pads may be laid out apart from each other at a sufficiently long distance.

This means that electrical insulation between the first and second conductive pads is ensured.

Moreover, since each of the first and second insulating sidewall spacers is made of a material having a lower dielectric constant than silicon nitride, the parasitic capacitance is decreased compared with the previously-described conventional structure in FIG. 2.

As a result, the semiconductor device according to the second aspect of the present invention can be readily miniaturized without the above problems relating to the parasitic capacitance and the electrical insulation.

Additionally, the first and second insulating sidewall spacers are made of $SiO_2$ and are located on the gate insulating layer and therefore, the hot-carrier resistance is difficult to degrade. This means that the long-term reliability is prevented from degrading with time.

In the semiconductor device according to the second aspect, preferably, the insulating cap is made of silicon nitride ($SiN_x$), silicon oxynitride ($SiON_x$), or alumina ($Al_2O_3$), because these materials have good etching resistance and good insulating characteristics.

Preferably, each of the first and second insulating sidewall spacers is made of silicon oxide ($SiO_x$), fluorine-containing silicon oxide (SiOF), Phosphor-Silicate Glass (PSG), or Boron-doped PSG (BPSG). These materials have lower dielectric constants than silicon nitride and good insulating characteristics.

It is preferred that each of the first and second conductive pads is made of silicon (Si) or tungsten (W), because these two materials are readily grown selectively on the first or second source/drain region.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1A:
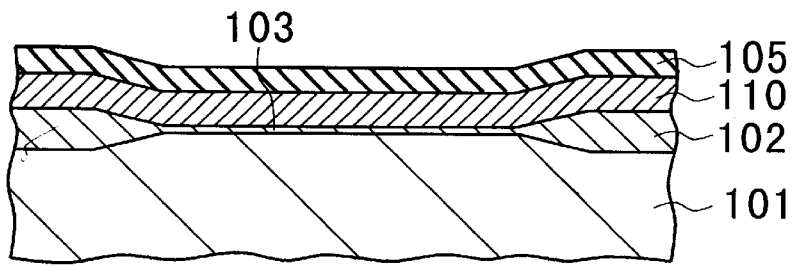
FIGS. 1A to 1F are a schematic, partial cross sectional views showing a fabrication method of a conventional semiconductor device, respectively.
Figure 1B:
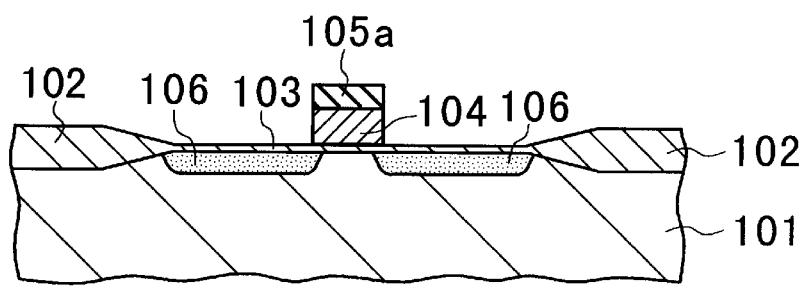

Preferred embodiments of the present invention will be described below referring to the drawings attached.

FIRST EMBODIMENT

Figure 3:
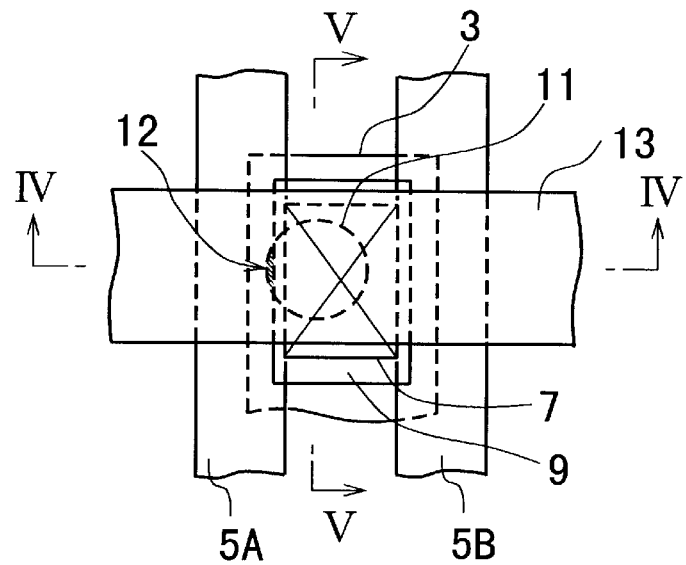
FIG. 3 is a schematic, partial plan view of a semiconductor device according to a first embodiment of the present invention.
Figure 4:
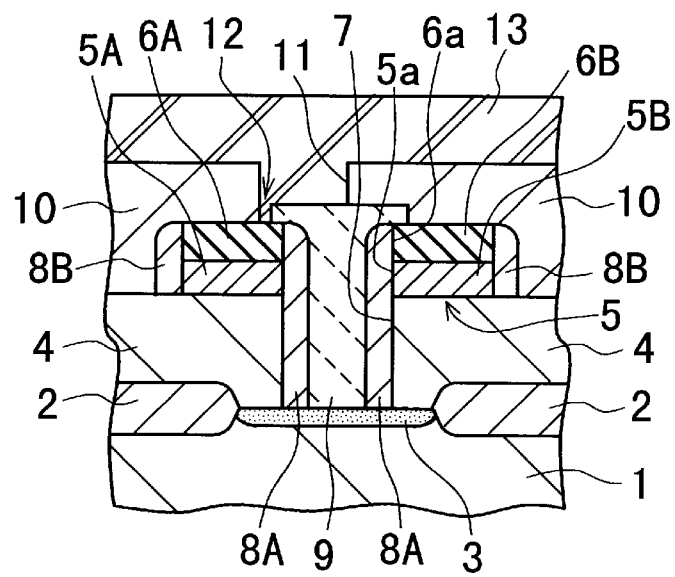
FIG. 4 is a schematic cross sectional view along the line IV—IV in FIG. 3.
Figure 5:
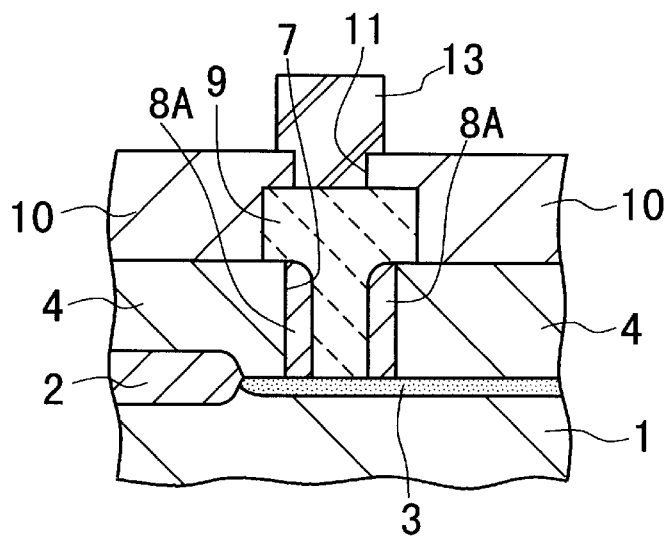
FIG. 5 is a schematic cross sectional view along the line V—V in FIG. 3.

A semiconductor device according to a first embodiment of the present invention is shown in FIGS. 3, 4, and 5, in which only one wiring structure is shown. It is needless to say that a plurality of the same wiring structures are provided in this semiconductor device. Only one of the wiring structures is explained here for the sake of simplification.

As shown in FIGS. 3, 4, and 5, a field oxide layer 2 is selectively formed on a main surface of a p-type silicon substrate 1, defining an active region. An n-type diffusion region or layer 3 is formed in the active region in the substrate 1. The diffusion region 3 serves as a first-level conductive layer. The region 3 has a rectangular plan shape, as shown in FIG. 3.

An interlayer insulating layer 4 is formed on the field oxide layer 2 and the diffusion region 3 over the whole substrate 1. The layer 4, which is formed by a CVD process, is preferably made of silicon oxide.

A second-level conductive layer 5 is formed on the interlayer insulating layer 4. The layer 5 has first and second linear sublayers 5A and 5B extending along the same direction. The sublayers 5A and 5B are separated from each other by a gap. Each of the sublayers 5A and 5B has a minimum processible width of F. The sublayers 5A and 5B has a minimum processible interval or distance of F.

First and second insulating caps 6A and 6B are formed on the first and second sublayers 5A and 5B, respectively. The whole top faces of the first and second sublayers 5A and 5B are covered with the first and second caps 6A and 6B, respectively. Each of the first and second insulating caps 6A and 6B is made of silicon nitride.

The first and second sublayers 5A and 5B and the first and second insulating caps 6A and 6B are fabricated as follows:

A proper conductive layer is formed on the interlayer insulating layer 4 and then, a silicon nitride layer is formed on the conductive layer. Next, the silicon nitride layer is patterned by popular lithography and etching processes using a mask, forming the first and second insulating caps 6A and 6B. The conductive layer is then patterned by popular lithography and etching processes using the same mask, forming the first and second sublayers 5A and 5B. As the etching processes, an RIE process may be used.

A contact hole 7 is formed in the interlayer insulating layer 4 to extend to the underlying n-type diffusion region 3. The contact hole 7 is self-aligned with both the first and second conductive sublayers 5A and 5B, here. However, the contact hole 7 may be s self-aligned with one of the sublayers 5A and 5B, as necessary. The size of the contact hole 7 may be smaller than the minimum processible size of F due to the lateral deviation of the sublayers 5A and 5B.

The contact hole 7 may be formed by the following processes.

A photoresist film with a window is formed on the interlayer insulating layer 4 to cover the first and second conductive sublayers 5A and 5B and the first and second insulating caps 6A and 6B. The window is located at the position corresponding to the contact hole 7. The minimum processible size of the window is F. Then, using the photoresist film as a mask, the interlayer insulating layer 4 is selectively etched by an RIE process using, for example, a gaseous mixture of tetrafluoromethane ($CF_4$) and difluoromethane ($CH_2F_2$) as an etchant. This etchant scarcely etches the silicon nitride caps 6A and 6B and therefore, it is said that the caps 6A and 6B serve as etching masks during this RIE process, respectively.

An inner insulating spacer 8A is formed on the diffusion region 3 to be contacted with the inner side faces of the interlayer insulating layer 4, the inner side faces 5a of the first and second conductive sublayers 5A and 5B, and the inner side faces 6a of the first and second insulating caps 6A and 6B. The spacer 8A has a rectangular plan shape, as shown in FIG. 3.

A pair of outer insulating spacers 8B are formed on the interlayer insulating layer 4 to be contacted with the outer side faces of the first and second conductive sublayers 5A and 5B and of the first and second insulating caps 6A and 6B. The outer insulating spacers 8B are located at each side of the contact hole 7. Each of the spacers 8B has a linear plan shape extending along the sublayers 5A and 5D, as shown in FIG. 3.

Figure 1C:
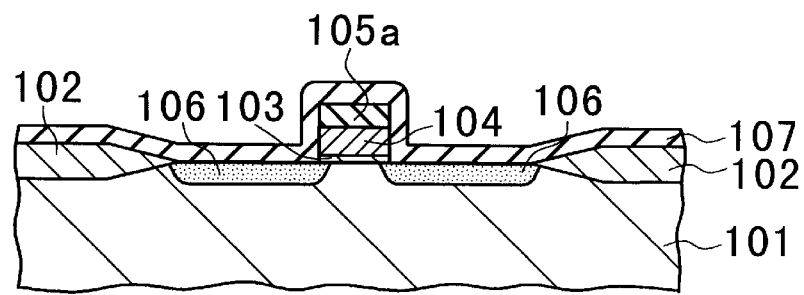
Figure 1D:
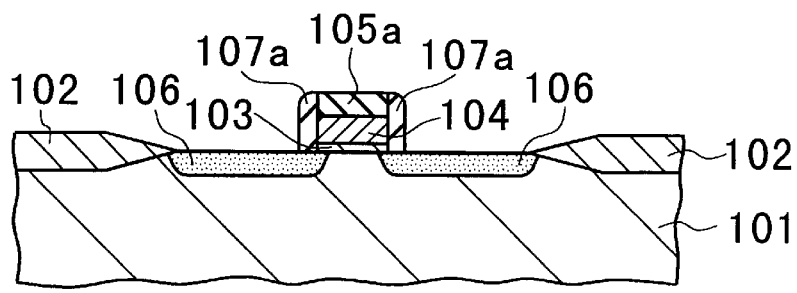
Figure 1E:
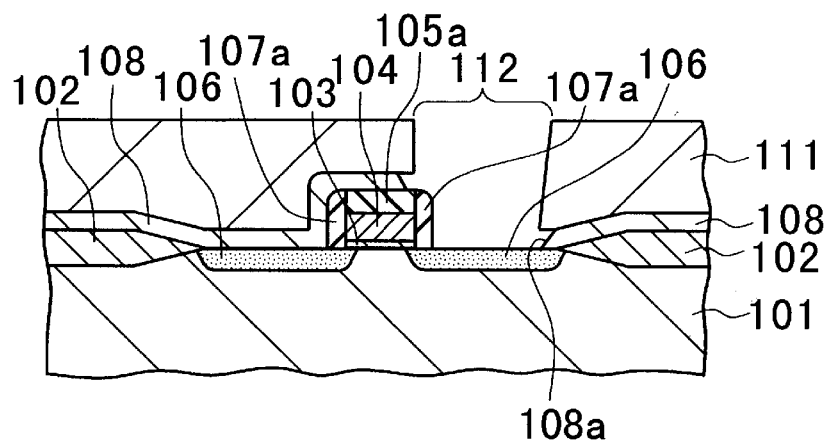
Figure 1F:
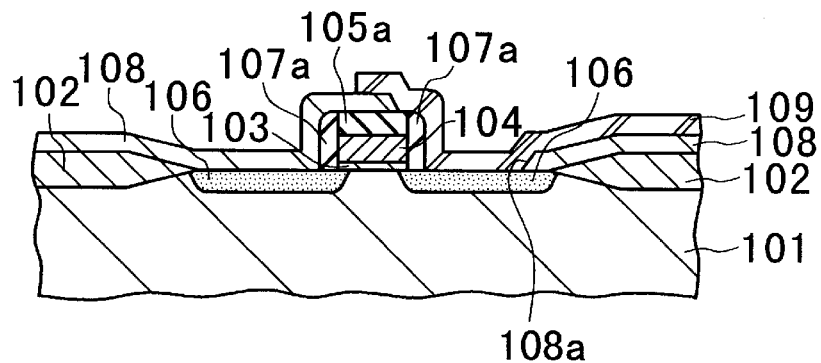

The insulating spacers 8A and 8B are formed by the same processes as those in the conventional method shown in FIGS. 1C and 1D. Specifically, a silicon oxide layer is formed on the interlayer insulating layer 4 to cover the sublayers 5A and 5B and the caps 6A and 6B. Then, the silicon oxide layer is etched back to be selectively left, as clearly shown in FIGS. 4 and 5.

The contact hole 7 is filled with a conductive silicon pad 9. The silicon pad 9 is separated and electrically insulated from the first and second conductive sublayers 5A and 5B of the second-level conductive layer 5 by the inner insulating spacer 8A. The pad 9 is made of n-type silicon to decrease its electric resistance. The top of the pad 9 is higher than the tops of the insulating caps 6A and 6B, and is overlapped with the inner insulating spacer 8A and the caps 6A and 6B.

Figure 2:
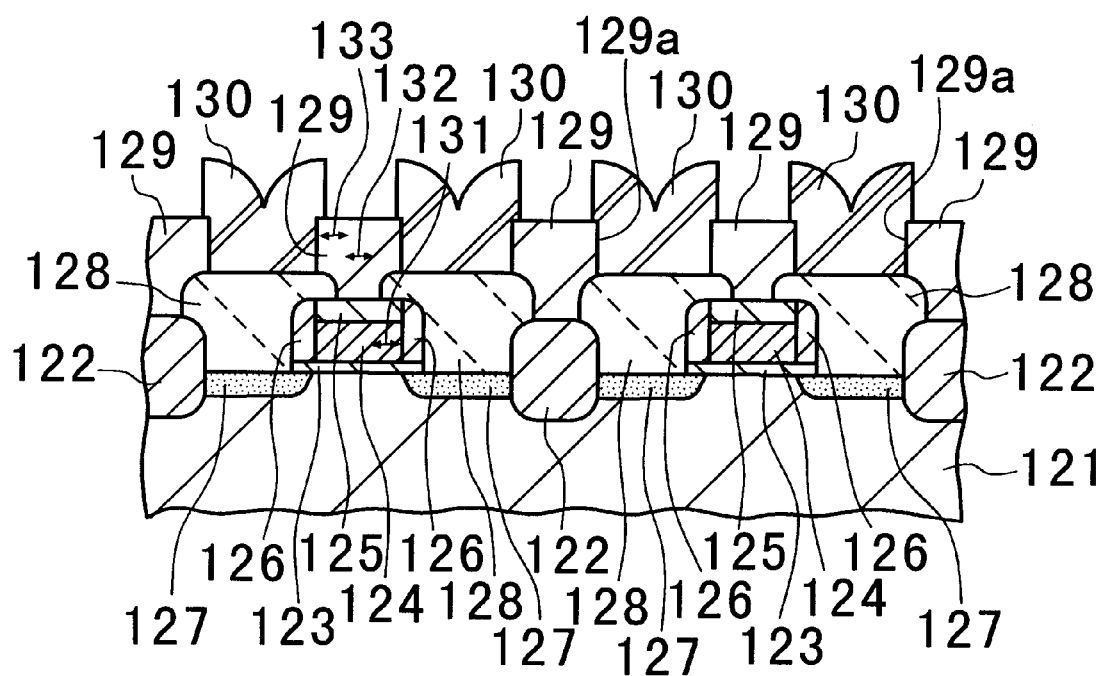
FIG. 2 is a schematic, partial plan view of another conventional semiconductor device.

The overlapped widths of the silicon pad 9 with the underlying the first and second conductive sublayers 5A and 5B may be smaller than the overlapped width 131 in the conventional structure in FIG. 2, because the conductive sublayers 5A and 5B are entirely covered with the caps 6A and 6B serving as the etching masks, respectively. Accordingly, the interval or distance of the silicon pad 9 to another adjoining silicon pad may be sufficiently wider than the interval 132 in the conventional structure in FIG. 2.

Further, unlike the conventional method shown in FIGS. 1A to 1F, the inner silicon oxide spacer 8 is located between the pad 9 and the conductive sublayers 5A and 5B in the first embodiment. Therefore, the parasitic capacitance will be decreased compared with the conventional one in FIGS. 1A to 1F.

The silicon pad 9 may be formed by single-crystal silicon or polycrystalline silicon, which is preferably grown on the diffusion region 3 by a known selective-growth process. The doping into the pad 9 may be performed during or after the crystal growth process.

A tungsten pad may be used instead of the silicon pad 9.

An interlayer insulating layer 10 is formed on the interlayer insulating layer 4 to cover the silicon pad 9, the conductive sublayers 5A and 5B, and the insulating caps 6A and 6B. This layer 10 is typically formed by a silicon oxide, PSG, or BPSG through a known CVD process.

A circular contact hole 11 is formed to extend the underlying silicon pad 9 in the interlayer insulating layer 10. The contact hole 11 has the minimum size of F and the minimum interval of F. The hole 11 is formed by the same process as that of the contact hole 7.

The overlapped width of the pad 9 with the sublayer 5A or 5B is narrower than the alignment margin, and the minimum interval of the sublayers 5A and 5B is F. Therefore, the caps 6A or 6B tends to be exposed from the interlayer insulating layer 10, resulting in the uncovered caps 6A or 6B through a void 12 in the contact hole 11, as clearly shown in FIG. 4.

A wiring layer 13 serving as a third-level conductive layer is formed on the interlayer insulating layer 10 to be contacted with and electrically connected to the conductive silicon pad 9. The wiring layer 13 extends along a direction perpendicular to the first and second conductive sublayers 5A and 5B of the second-level conductive layer 5.

Thus, the third-level conductive layer 13 is electrically connected to the first-level conductive layer 3 through the conductive silicon pad 9 while the third-level conductive layer 13 is electrically insulated from the second-level conductive layer 5.

As described above, with the semiconductor device according to the first embodiment, the silicon nitride insulating caps 6A and 6B are formed on the conductive sublayers 5A and 5B, respectively. Consequently, even if the void 12 is generated in the contact hole 11 of the interlayer insulating layer 10 to uncover the first or second insulating cap 6A or 6B in the hole 11, the thickness of the insulating caps 6A and 6B will be scarcely decreased during the etching process of forming the contact hole 11 in the layer 10.

As a result, both of the electrical insulation between the wiring layer 13 (the third-level conductive layer) and the conductive sublayers 5A and 5B (the second-level conductive layer) and the electrical insulation between the adjoining two silicon pads 9 can be ensured simultaneously.

As a variation of the first embodiment, another interlayer insulating layer may be additionally formed between the upper and lower interlayer insulating layers 4 and 10. In this case, the second-level conductive layer 5 including the first and second conductive sublayers 5A and 5B and the first and second insulating caps 6A and 6B, which are formed on or over the lower interlayer insulating layer 4, are covered with the additional interlayer insulating layer. The surface of the additional interlayer insulating layer is usually planarized by a Chemical/Mechanical Polishing process or the like.

Further, the contact hole 7 penetrates the additional interlayer insulating layer and the lower interlayer insulating layer 4 to the diffusion region 3. The silicon oxide spacer 8A is formed in the contact hole 7 to cover the inner side faces of the lower interlayer insulating layer 4, of the first and second conductive sublayers 5A and 5B, and of the first and second insulating caps 6A and 6B.

The tops of the first and second insulating caps 6A and 6B may be or may not be in the same level as that of the additional interlayer insulating layer.

The field oxide layer 2 may be formed to be buried in a trench formed in the substrate 1. In other words, a trench isolation structure may be used in the first embodiment.

SECOND EMBODIMENT

Figure 6:
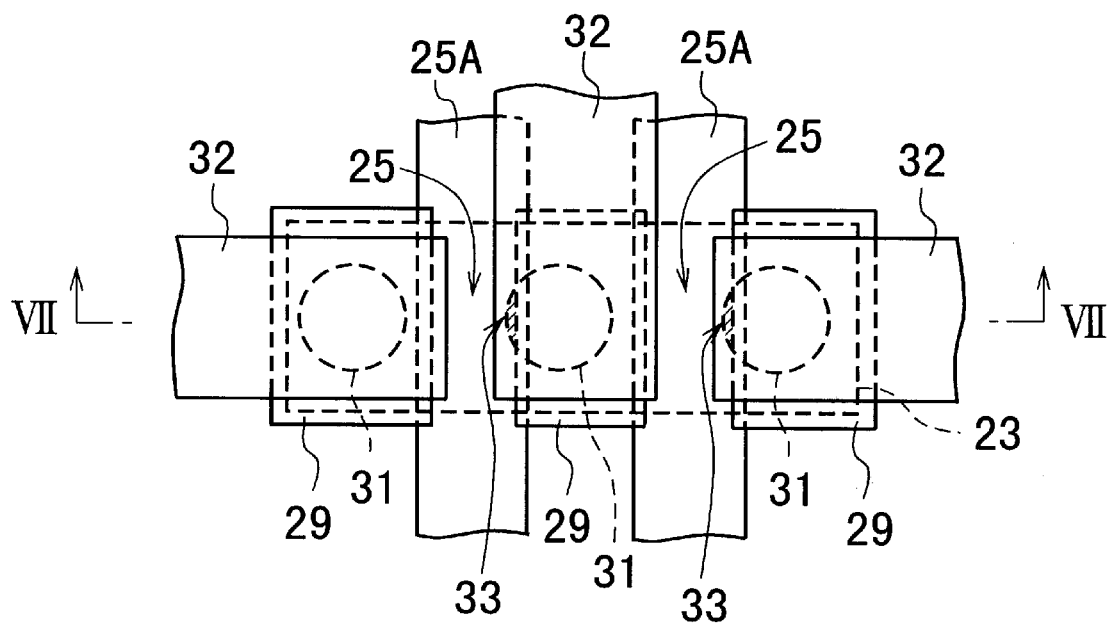
FIG. 6 is a schematic, partial plan view of a semiconductor device according to a second embodiment of the present invention.
Figure 7:
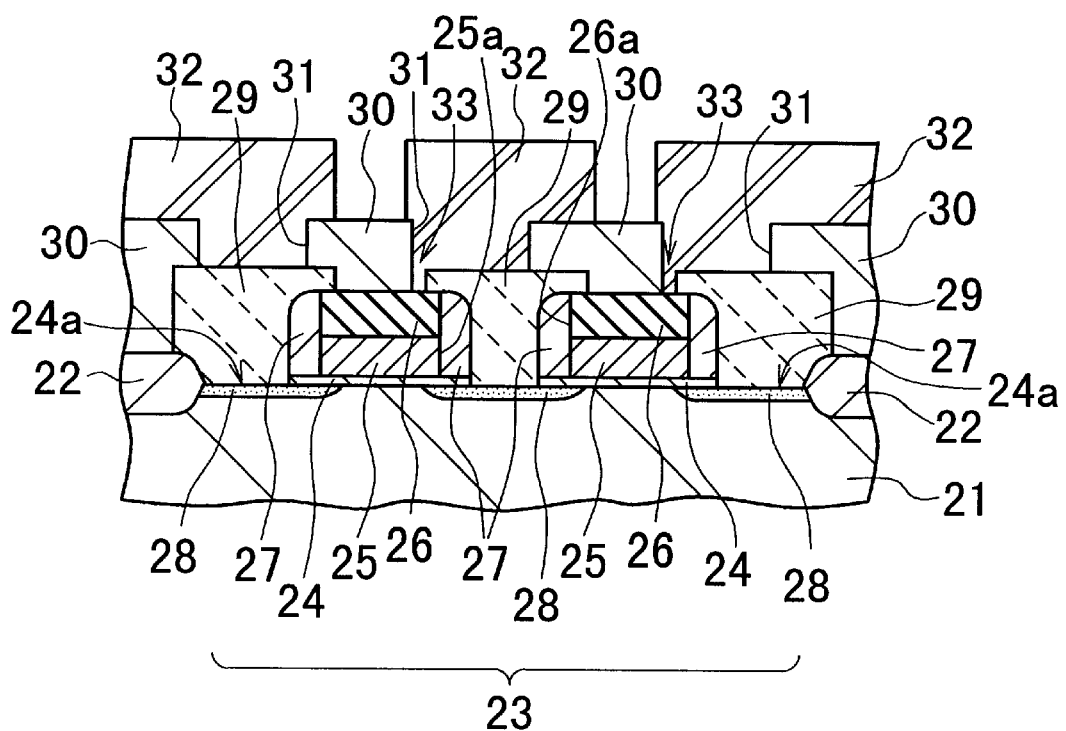
FIG. 7 is a schematic cross sectional view along the line VII—VII in FIG. 6.

A semiconductor device according to a second embodiment of the invention is shown in FIGS. 6 and 7, which includes two MOSFETs. This embodiment corresponds to a case where the wiring structure according to the first embodiment is applied to MOSFETs.

A field oxide layer 22 is selectively formed on a main surface of a p-type silicon substrate 21, defining an active region 23. Two gate oxide layers 24 are formed on the main surface of the substrate 21 in the region 23. Two gate electrodes 25 are formed on the gate oxide layers 24, respectively.

The minimum processible width of each gate electrode 25 and the minimum processible interval of the adjacent gate electrodes 25 are F (=0.15 μm), respectively.

The gate electrodes 25 serve as a second-level conductive layer.

Two insulating caps 26 with a thickness of approximately 100 nm are formed on the two gate electrodes 25, respectively. The whole tops of the gate electrodes 25 are covered with the insulating caps 26, respectively.

Three n-type diffusion regions 28 serving as source/drain regions are formed in the substrate 21 in the active region 23. The regions 28 are self-aligned with the two gate electrodes 25 and the field oxide layer 22.

The diffusion regions 28 serve as a first-level conductive layer. The regions 28 have a rectangular plan shape, as shown in FIG. 6.

The side faces 25a of the gate electrodes 25 and the side faces 26a of the insulating caps 26 are covered with four insulating sidewall spacers 27, respectively. Each of the sidewall spacers 27, which has a thickness of approximately 40 nm, is formed by patterning a silicon oxide layer.

The gate oxide layer 24 has three windows 24a uncovering the respective diffusion regions 28. A left-hand side one of the windows 24a is self-aligned with the left-hand side gate electrode and the opposing field oxide layer 22. A right-hand side one of the windows 24a is self-aligned with the right-hand side gate electrode and the opposing field oxide layer 22. A central one of the windows 24a is self-aligned with the two gate electrodes 24.

The windows 24a are formed during a process of forming the sidewall spacers 27. Specifically, since the sidewall spacers 27 are formed by etching a silicon oxide layer back (which is explained in the first embodiment), the gate oxide layer 24 is selectively etched by the etching action during this process to be self-aligned with the insulating spacers 27 and the field oxide layer 22.

The minimum processible size of the windows 24a may be 0.15 μm or less.

Three conductive silicon pads 29 are formed on the diffusion regions 28 through the corresponding windows 24a of the gate oxide layer 24, respectively. The pads 29 are contacted with and electrically connected to the corresponding diffusion regions 28. Each of the pads 29 is separated and electrically insulated from the corresponding gate electrode or electrodes 25 by the corresponding insulating sidewall spacer or spacers 27. Each of the pads 29 is made of n-type silicon to decrease its electric resistance. The tops of the pads 29 are higher than the tops of the insulating caps 26, and are overlapped with the insulating spacers 27 and the insulating caps 26. The tops of the pads 29 are overlapped with the neighboring field oxide layer 22 also.

It is sufficient that the overlapped width of the silicon pad 29 with the corresponding gate electrode 25 is 0.01 μm (10 nm), which may be smaller than the alignment margin of 0.05 μm and the overlapped width 131 in the conventional structure in FIG. 2, because the gate electrodes 25 are entirely covered with the insulating caps 26 serving as the etching masks, respectively. Accordingly, like the first embodiment, the interval or distance of the silicon pads 29 may be sufficiently wider than the interval 132 in the conventional structure in FIG. 2.

Further, unlike the conventional method shown in FIGS. 1A to 1F, the silicon oxide spacer 27 is located between the silicon pad 29 and the corresponding gate electrode 25 in the second embodiment. Therefore, the parasitic capacitance will be decreased compared with the conventional one in FIGS. 1A to 1F.

The silicon pads 29 may be formed by single-crystal silicon or polycrystalline silicon, which is preferably grown on the diffusion regions 28 by a known selective-growth process. The doping into the pad 29 may be performed during or after the crystal growth process.

A tungsten pad may be used instead of the silicon pad 29.

An interlayer insulating layer 30 is formed on the substrate to cover the field oxide layer 22, the silicon pads 29, the gate electrodes 25, and the insulating caps 26. This layer 30 is typically formed by a silicon oxide, PSG, or BPSG through a known CVD process.

Three circular contact holes 31 are formed to extend the underlying silicon pads 29 in the interlayer insulating layer 30. Each of the contact holes 31 has the minimum size of F (=0.15 μm) and the minimum interval of F. The holes 31 are formed by the same process as that of the contact holes 7 and 12 in the first embodiment.

The overlapped width of each pad 9 with the corresponding gate electrode 25 is narrower than the alignment margin, and the minimum interval of the gate electrodes 25 is F. Therefore, one of the insulating caps 26 tends to be exposed from the interlayer insulating layer 30, resulting in the uncovered caps 26 through a void 33 in the contact hole 31, as clearly shown in FIG. 7.

Wiring layers 32 serving as a third-level conductive layer are formed on the interlayer insulating layer 30 to be contacted with and electrically connected to the conductive silicon pads 29, respectively. The wiring layers 32 extend along a direction perpendicular to the gate electrodes 25 serving as the second-level conductive layer.

Thus, the third-level conductive layer 32 is electrically connected to the first-level conductive layer 28 through the conductive silicon pads 29 while the third-level conductive layer 32 is electrically insulated from the second-level conductive layer 25.

As described above, with the semiconductor device according to the second embodiment, the silicon nitride insulating caps 26 are formed on the gate electrodes 25, respectively. Consequently, even if the void 33 is generated in the contact hole 31 of the interlayer insulating layer 30 to uncover at least one of the insulating caps 26 in the hole 31, the thickness of the insulating caps 26 will be scarcely decreased during the etching process of forming the contact hole 31 in the layer 30.

As a result, both of the electrical insulation between the wiring layer 32 (the third-level conductive layer) and the gate electrodes 25 (the second-level conductive layer) and the electrical insulation between the adjoining two silicon pads 29 can be ensured simultaneously.

Moreover, in the second embodiment, the side faces 25a of the gate electrodes 25 are covered with the silicon oxide spacers 27, respectively. Therefore, the MOSFETs in the second embodiment have an improved hot-carrier resistance. This means that the long-term reliability of the MOSFETs is prevented from degrading with time.

The following test results were obtained by the inventor.

When the gate oxide layer 24 had a thickness of 7.5 nm, and a source-to-drain voltage was set as 2.4 V in the second embodiment, the lifetime of the MOSFETs was 10 years.

On the other hand, in the conventional wiring structure previously-explained with reference to FIGS. 1A to 1F, when the gate oxide layer 103 had a thickness of 7.5 nm, and a source-to-drain voltage was set as 2.0 V (which is lower than 2.4 V), the lifetime of the MOSFET was 10 years.

The results indicate that the long-term reliability of the semiconductor device according to the second embodiment is longer than that of the conventional one.

As a variation of the second embodiment, another interlayer insulating layer may be additionally formed between the interlayer insulating layer 30 and the substrate 21. The surface of the additional interlayer insulating layer is usually planarized by a CMP process or the like.

In this case, instead of the windows 24a of the oxide layer 24, contact holes extending to the corresponding diffusion regions 28 are formed in the additional interlayer insulating layer. The inner faces of the contact holes are covered with silicon oxide spacers, respectively. This variation will be similar to the wiring structure according to the first embodiment.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor device comprising:
   (a) a first-level conductive layer formed on a semiconductor substrate;
   (b) a first interlayer insulating layer formed on said substrate to cover said first-level conductive layer;
   said first interlayer insulating layer having a first contact hole extending to said first-level conductive layer;
   (c) a second-level conductive layer formed on said first interlayer insulating layer;
   said second-level conductive layer having first and second conductive sublayers separated from each other by a gap;
   (d) first and second insulating caps formed on said first and second conductive sublayers of said second-level conductive layer, respectively;
   said first and second insulating caps being separated from each other by a gap;
   said first and second insulating caps completely covering a top face of each of said first and second conductive sublayers, respectively;
   said gap of said first and second insulating caps and said gap of said first and second conductive sublayers communicating with said first contact hole of said first insulating layer; said first contact hole being self-aligned with said at least one of said first and second conductive sublayers;
   (e) an insulating spacer formed in said first contact hole to cover inner side faces of said first and second conductive sublayers of said second-level conductive layer;
   said insulating spacer being made of a material having a lower dielectric constant than silicon nitride;
   (f) a conductive pad formed in said first contact hole to be contacted with and electrically connected to said first-level conductive layer;
   the top of said conductive pad being overlapped with said first and second insulating caps;
   said conductive pad being electrically insulated from said first and second conductive sublayers of said second-level conductive layer by said insulating spacer;
   (g) a second interlayer insulating layer formed on said first interlayer insulating layer to cover said second-level conductive layer, said first and second insulating caps, and said conductive pad;
   said second interlayer insulating layer having a second contact hole extending to said conductive pad;
   said second contact hole communicating with said first contact hole through said gap of said first and second insulating caps and said gap of said first and second conductive sublayers;

(h) each of said first and second insulating caps being made of an etching resistant material against an etching action applied during a process of forming said second window in said second interlayer insulating layer; and (i) a third-level conductive layer formed on said second interlayer insulating layer to be contacted with and electrically connected to said conductive pad through said second contact hole;

wherein said third-level conductive layer is electrically connected to said first-level conductive layer through said conductive pad while said third-level conductive layer is electrically insulated from said second-level conductive layer.

2. A device as claimed in claim 1, wherein each of said first and second insulating caps is made of one selected from the group consisting of silicon nitride, silicon oxynitride, and alumina.

3. A device as claimed in claim 1, wherein said insulating spacer is made of one selected from the group consisting of silicon oxide, fluorine-containing silicon oxide, Phosphor-Silicate Glass, and Boron-doped Phosphor-Silicate Glass.

4. A device as claimed in claim 1, wherein said conductive pad is made of one selected from the group consisting of silicon and tungsten.

5. A semiconductor device comprising:

(a) a semiconductor substrate of a first conductivity type;

(b) a gate insulating layer formed on said substrate;

(c) a gate electrode formed on said gate insulating layer;

(d) an insulating cap formed on said gate electrode;
said insulating cap covering the whole top face of said gate electrode;

(e) first and second insulating sidewall spacers formed on said gate insulating layer at each side of said gate electrode;
said first sidewall spacer covering side faces of said gate electrode and said cap at one side of said gate electrode;
said second sidewall spacer covering side faces of said gate electrode and said cap at the other side of said gate electrode;

(f) first and second source/drain regions of a second conductivity type formed in said substrate at each side of said gate electrode;
said first and second source/drain regions being self-aligned with said gate electrode;

(g) first and second windows formed in said gate insulating layer to uncover said first and second source/drain regions, respectively;
said first and second windows being self-aligned with said first and second insulating sidewall spacers, respectively;

(h) first and second conductive pads formed to be contacted with and electrically connected to said first and second source/drain regions through said first and second windows, respectively;
the tops of said first and second conductive pads being higher than the top of said insulating cap;
the tops of said first and second conductive pads being overlapped with said insulating cap;

(i) an interlayer insulating layer formed on or over said substrate to cover said first and second conductive pads, said first and second insulating sidewall spacers, and said insulating cap;
said interlayer insulating layer having first and second contact holes extending to said first and second conductive pads, respectively; and (j) a conductive wiring layer formed on said interlayer insulating layer to be contacted with and electrically connected to said first and second conductive pads through said first and second contact holes of said interlayer insulating layer, respectively.

6. A device as claimed in claim 5, wherein said insulating cap is made of one selected from the group consisting of silicon nitride, silicon oxynitride, and alumina.

7. A device as claimed in claim 5, wherein each of said first and second insulating sidewall spacers is made of one selected from the group consisting of silicon oxide, fluorine-containing silicon oxide, Phosphor-Silicate Glass, and Boron-doped Phosphor-Silicate Glass.

8. A device as claimed in claim 5, wherein each of said first and second conductive pads is made of one selected from the group consisting of silicon and tungsten.

* * * * *